US009077171B2

(12) United States Patent
Givelin et al.

(10) Patent No.: US 9,077,171 B2
(45) Date of Patent: Jul. 7, 2015

(54) GROUND LOSS MONITORING CIRCUIT AND INTEGRATED CIRCUIT COMPRISING THE SAME

(75) Inventors: Philippe Givelin, Leguevin (FR); Patrice Besse, Tournefeuille (FR); Estelle Huynh, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 2 days.

(21) Appl. No.: 14/122,538

(22) PCT Filed: May 27, 2011

(86) PCT No.: PCT/IB2011/001591
§ 371 (c)(1),
(2), (4) Date: Nov. 26, 2013

(87) PCT Pub. No.: WO2012/164332
PCT Pub. Date: Dec. 6, 2012

(65) Prior Publication Data
US 2014/0092500 A1    Apr. 3, 2014

(51) Int. Cl.
*H02H 9/00* (2006.01)
*H02H 1/00* (2006.01)
(Continued)

(52) U.S. Cl.
CPC ............ *H02H 1/0007* (2013.01); *G01R 31/025* (2013.01); *G01R 31/2853* (2013.01); *G01R 31/2884* (2013.01)

(58) Field of Classification Search
USPC .......................................... 361/18, 56, 86–87
See application file for complete search history.

(56) References Cited

U.S. PATENT DOCUMENTS

| 6,208,494 | B1 * | 3/2001 | Nakura et al. ................... 361/56 |
| 6,560,079 | B1 | 5/2003 | Hirsh et al. |
| 7,760,476 | B2 | 7/2010 | Riviere et al. |

(Continued)

FOREIGN PATENT DOCUMENTS

| DE | 19844465 A1 | 4/2000 |
| EP | 0519156 A1 | 12/1992 |

(Continued)

OTHER PUBLICATIONS

ST: "IEC 61000-4-2 standard testing", Doc ID 018527 Rev 1, Jun. 2011, pp. 1-9.
Electronic Industries Association: "EIA/JESD22-A115-A", Electrostatic Discharge (ESD) Sensitivity Testing Machine (MM). Oct. 1997. pp. 1-11.

(Continued)

*Primary Examiner* — Danny Nguyen

(57) ABSTRACT

A reference voltage loss monitoring circuit having a first and second reference node. The reference nodes are connected to a voltage reference. A first connection device is connects the first reference node to the second reference node, and includes a first diode to allow a current flowing from the first reference node to the reference ground node and not conversely. The first diode includes a first main transistor. A second connection device connects the second reference node to the first reference node, and includes a second diode to allow a current flowing from the second reference node to first reference node and not conversely. The second diode includes a second main transistor. Each of the first and second connection devices further includes a secondary transistor mirrored with the main transistor of the connection devices. The secondary transistor has an output coupled to a diagnostic circuit, for delivering to the diagnostic circuit a signal indicative of a loss of voltage reference on a respective reference node.

18 Claims, 3 Drawing Sheets

(51) Int. Cl.
   *G01R 31/28*   (2006.01)
   *G01R 31/02*   (2006.01)

(56) References Cited

U.S. PATENT DOCUMENTS

| | | |
|---|---|---|
| 2003/0030447 A1 | 2/2003 | Masaoka |
| 2007/0103165 A1 | 5/2007 | Gaston et al. |
| 2007/0291429 A1* | 12/2007 | Kawachi .................. 361/56 |
| 2009/0002055 A1 | 1/2009 | Kojima |
| 2010/0045328 A1 | 2/2010 | Suto |

FOREIGN PATENT DOCUMENTS

| | | |
|---|---|---|
| EP | 0696849 A2 | 2/1996 |
| EP | 0735640 A1 | 10/1996 |
| EP | 1305922 B1 | 12/2004 |
| EP | 2157437 A1 | 2/2010 |
| WO | 2009/147471 A1 | 12/2009 |

OTHER PUBLICATIONS

International Search Report and Written Opinion correlating to PCT/IB2011/001591 dated Feb. 17, 2012.

* cited by examiner

GROUND LOSS MONITORING CIRCUIT AND INTEGRATED CIRCUIT COMPRISING THE SAME

FIELD OF THE INVENTION

This invention relates to a ground loss monitoring circuit, an integrated circuit and a control device.

BACKGROUND OF THE INVENTION

Safety related and other critical devices usually have several voltage references, namely two, three or more voltage references. Of particular importance is the tolerance of such devices to failures which may affect any single one of these voltage references, like loss of the connection to ground by a ground node (called "ground loss"), such as by a ground pad of an integrated circuit to the external ground e.g. due to a disconnecting bond-wire, or to another voltage reference node.

Some or all of the available voltage reference nodes of an electronic device may be connected such that the voltage reference nodes are all at the same electrical potential, even in case of a loss of the connection to the reference voltage source for a specific node. For example. European patent application publication EP-0519156 A discloses a protection of an output driver with an extra ground circuit to prevent the loss of connection between a reference node of the driver and ground of the driver. In case of a loss of connection, an additional path between the reference node and the output terminal of the driver is enabled. The additional path provides the voltage at the output terminal to the reference node and thus avoids that the driver becomes dysfunctional.

SUMMARY OF THE INVENTION

The present invention provides a ground loss monitoring circuit, an integrated circuit and a control device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

Figure 1:
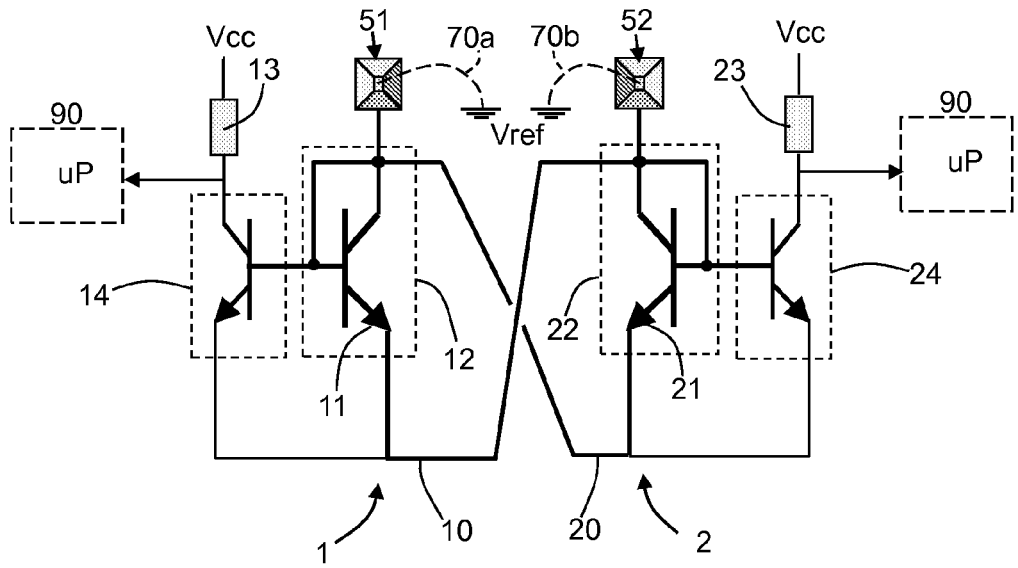
FIG. 1 schematically shows a circuit diagram of a first example of an embodiment of a ground loss monitoring circuit having two ground pads.

FIG. 1 shows an example of a ground loss monitoring circuit. Such a circuit may be used, in particular, but not exclusively, in an electronic device, e.g. which uses an integrated circuit in which the ground loss monitoring circuit is implemented. Such electronic device may be, for instance, a vehicle controller, an elevator controller, a fire prevention system, or other suitable electronic device. When, for example, an integrated circuit is embedded in a control unit of a safety related or otherwise critical system or function, a challenging task is to ensure redundancy of the ground links inside said integrated circuit. Redundant ground links may be provided at the PCB level of a controller in order to improve the reliability. To obtain redundancy, the integrated circuit or electronic device, may be provided with several reference voltage node which are connected to an external reference voltage source, e.g. to ground in case the reference voltage is ground.

The shown example of a monitoring circuit comprises two ground nodes 51 and 52, e.g. supply voltage terminals or pins of an integrated circuit, or of a printed circuit board (PCB), of a control unit. The ground nodes 51 and 52 are arranged to receive the same reference voltage Vref, e.g. the ground potential, e.g., via a respective wire bonding 70a and 70b that is attached to the ground node at one end and to a reference potential at the other, opposite end, respectively. It will be apparent that the ground nodes 51,52 may be connected to the reference potential in any other suitable manner. When, for instance the ground nodes 51,52 are pads of a PCB, the voltage reference Vref may be received via wires of a wiring harness connected to a suitable, external reference potential.

The reference voltage may be different from the ground potential of the electronic circuit, and the term 'reference voltage' is not limited to a ground potential although the concept is elucidated in the examples with reference to a ground potential. Furthermore, it will be apparent that where in the examples ground is used, another reference voltage may be used as well unless not suitable.

Figure 2:
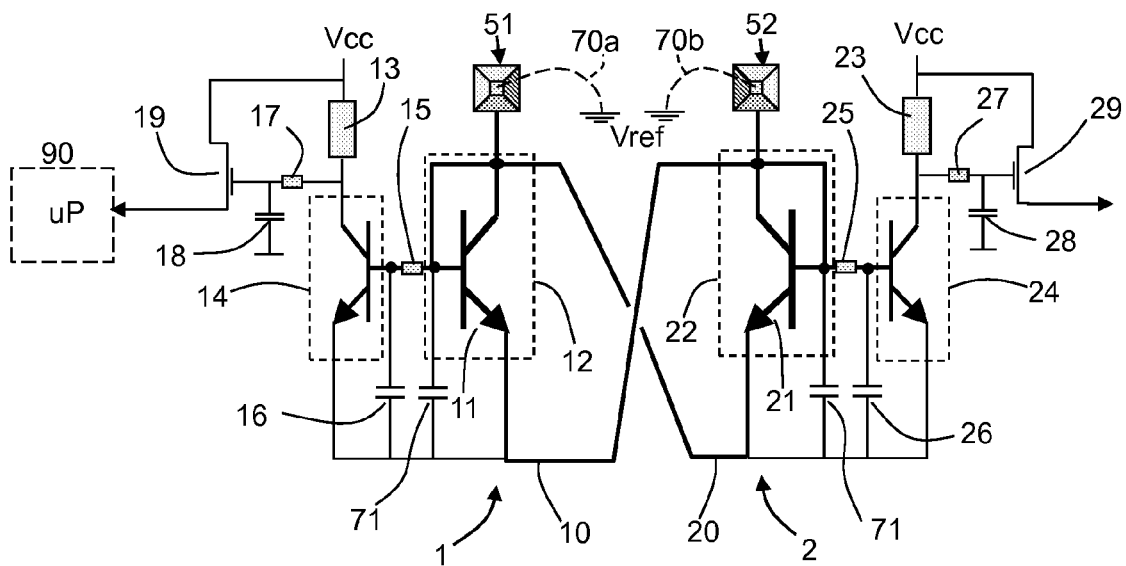
FIG. 2 schematically shows a circuit diagram of a second example of an embodiment of a ground loss monitoring circuit suitable for the example of FIG. 1, FIGS. 3a and 3b schematically show an example of an embodiment of a ground loss monitoring circuit having three ground pads.

In the example shown in FIGS. 1 and 2, a first connection device 1 is arranged to establish a connection from the first ground node 51 to the second ground node 52. The first connection device 1 may, as shown, comprise a first diode 11 arranged to allow a current flowing from said first ground node 51 to said second ground node 52 and not conversely, through a first ground path 10. Diode 11 may comprise, as shown, a main transistor 12 connected to operate as a first diode.

The main transistor 12 can e.g. be an N-type bipolar transistor, such as a N-type bipolar or field effect transistor. A bipolar transistor can e.g. be connected to operate as a diode by directly connecting the collector to the base. A FET transistor can e.g. be connected to operate as a diode by directly connecting the gate to the drain. In the shown example, the diodes are part of a protection against electrostatic discharge, which in case of an ESD event on a ground node, e.g on a first node 51 re-directs the current to the other ground nodes, e.g. to a second node 52, and diverts the ESD current from the circuitry connected to the ground node which has been hit by the ESD. The current capability of the main transistor 12 is chosen so as to be sufficient to withstand the current sunk to the ground via the first ground node 51 under any conditions of operation of the electronic device, i.e. to withstand a current spike well above normal operating conditions, such as for example an ESD discharge in accordance with the gun or machine model ESD event as specified in International Electronics Commission (IEC), standard 61000-4-2 and Joint Election Device Engineering Course JESD22-A115A respectively.

The first connection device 1 may further comprise a first secondary transistor 14, which is mirrored with the first main transistor 12. The first connection device 1 shown in the example thus comprises a current mirror. In the shown example, the first secondary transistor is an N-type transistor 14, such as a NPN bipolar transistor or a N-channel FET. In the shown example, the control terminal, e.g. base, of the first secondary transistor 14 is connected to the control terminal, e.g. base of the first main transistor 12.

The output terminal, e.g. the collector in this example, of the first secondary transistor 14 may be coupled to a diagnostic circuit. For instance, the diagnostic circuit 90 may be internal or external to the integrated circuit. In the shown example, the secondary transistor 14 is connected to a microcontroller circuit 90, and more in particular, a current terminal, the collector, of the first transistor 14 is pulled up to a positive voltage supply Vcc via a pull-up resistor 13 and connected to a microcontroller circuit 90, which thus receives a voltage corresponding to the current through the first secondary transistor 14.

A second connection device 2 is arranged to establish a connection from the second ground node 52 to the first ground node 51. Said device 2 may comprise a second diode 21 arranged to allow a current flowing from said second ground node 52 to said first ground node 51 and not conversely, through a second ground path 20. Diode 21 may be, e.g., be implemented like the diode 11, as a second main transistor 22 connected to operate as a diode and may be implemented similar to the diode 11.

The second connection device 2 further comprises a second secondary transistor 24 which is mirrored with the second main transistor 22 and which may otherwise be implemented similar to the first secondary transistor, and as shown have a terminal which is pulled up to a supply voltage Vcc supply via a pull-up resistor 23, and which is connected to a respective diagnostic circuit 90.

The shown example can operate as follows. In the event of a loss of voltage reference, i.e. of a ground loss on one of the ground nodes 51 and 52, the corresponding connection device 1 or 2, respectively, establishes a current flow between the respective ground node 51 and the other ground node 52 through the first ground path 10 or the second ground path 20, respectively. In addition, the corresponding secondary transistor 14 or 24, respectively, is activated, namely becomes conductive and provides a secondary current proportional to the main current through the main transistor. The ratio of the secondary current to the main current may be any ratio suitable for the specific implementation, for example in the range between (and including) 1:50 and 1:100. The secondary current may for example be the smallest current that detected by a diagnostic circuit.

For example, if the wire 70b attached to the node 52 is broken or becomes disconnected at one end, e.g. becomes disconnected from the node 52, due to e.g. a disrupted solder, the voltage at ground node 52 rises above the voltage at ground node 51. When the voltage difference between these nodes exceeds the threshold voltage of the diode 21, said diode 21 turns on, namely become conductive and a current flows through the diode 21 due to the voltage difference between the nodes 51,52.

The activation may be reported to a diagnostic circuit 90. In the shown example, the main current triggers an activation signal generated by the secondary current, and more specific which is driven by the current terminals, collector (or drain), of the secondary transistor 14 or 24, respectively. At the collector of the secondary transistor 14 or 24, the voltage is at a logical high state in normal condition due to pull up resistors 13,23, and the non conductive state of the secondary transistor. However, when the secondary transistor 14 or 24 is conductive, the voltage at the collector of the secondary transistor 14 or 24 turns to a logical low state. The voltage is fed to the diagnostic circuit through the path between the terminal and the circuit 90 thereby providing a signal the diagnostic circuit 90 that the secondary transistor 14,24 is conductive and hence that a loss of reference voltage has occurred.

Due to the connection device 2, the voltage at ground node 52 stabilizes around the forward voltage drop of the diode 21, e.g. below 0.5 volt. Thus, the voltage at ground node 52 is not floating, and provides a degraded but yet sufficient ground sinking capability for any circuit connected to the ground node. Furthermore, the mirrored transistor, namely the second secondary transistor 24 in the shown example, provides a signal which notifies the diagnostic circuit 90 with the ground link failure. As a result, a failure warning can be generated at the system level, which indicates that some protection has been lost. In general, the system operation remains possible but certain functionalities may be disabled in response to the signal from transistor 24.

As shown in the example of the embodiment shown in FIG. 2, there may be provided at least one main filter which filters certain undesired components from the signals provided to the diagnostic circuit 90. For example, high frequency signals generated by e.g. a vehicle passing below a power line, can be filtered. The filters may also, for example, filter an ESD (Electro Static Discharge) or Electro-Magnetic (EMC) spike such that it does not trigger the secondary transistor 14,24. As a result, false alarms due to electrical spikes or ESD discharges may be avoided. Thus, a strong enough ESD discharge can still trigger the ESD protection provided by the diode 11,21 of the connection device 1,2 but does not cause a ground protection alarm to be raised in the diagnostic circuit 90. In the shown example, R-C filters 15,16 and 25,26 are provided between the main transistor 12 or 22 and the corresponding secondary transistor 14 or 24, respectively. The R-C filter is arranged and sized so that the delay introduced by said R-C filter is such that the secondary 14 or 24 stays in the Off state in the event of an ESD triggered conduction of the main transistor 12 or 22. More specific, in this example the resistor of the RC filter 15,25 connects the control terminals, e.g. bases or gates, of the secondary transistor. The control terminal is further connected by a respective capacitor to a current terminal, e.g. emitter or source, of the secondary transistor.

As shown in FIG. 2, the ground loss monitoring system may comprise one of auxiliary transistors 19 and 29, for instance a P-type transistor, acting as a buffer stage, which provides further protection against false alarms.

As also shown in FIG. 2, at least one of the connection device 1 and 2 may further comprise an auxiliary filter, such as an R-C filter 17,18 or 27,28, respectively, which is arranged between a current terminal, e.g. collector or drain, of the secondary transistor 14,24 and the control terminal of the auxiliary transistor 19 or 29, respectively. The auxiliary filter is arranged to filter out signals caused by a loss of voltage reference or other event of a short duration, e.g. with a duration less than a detection threshold period T. In the shown example, the auxiliary filter is an RC filter sized and arranged so that a loss of voltage reference having a time smaller than a predetermined threshold does not trigger the auxiliary transistor 19,29. Thus, the accuracy of the ground loss detection can be improved while providing a very good protection against false alarms in case of any electrical short time disturbances including so-called micro-cuts.

In the shown example, at least one of the connection devices 1 and 2 may comprise a EMC capacitor 71 interposed between the control terminal and current terminal, in the shown example between the base and the emitter, of the main transistor 12, 22, respectively. Said EMC capacitor 71 is arranged and sized so as to reduce the amplitude of incoming electrical spikes that may affect voltage reference.

Figure 3A:
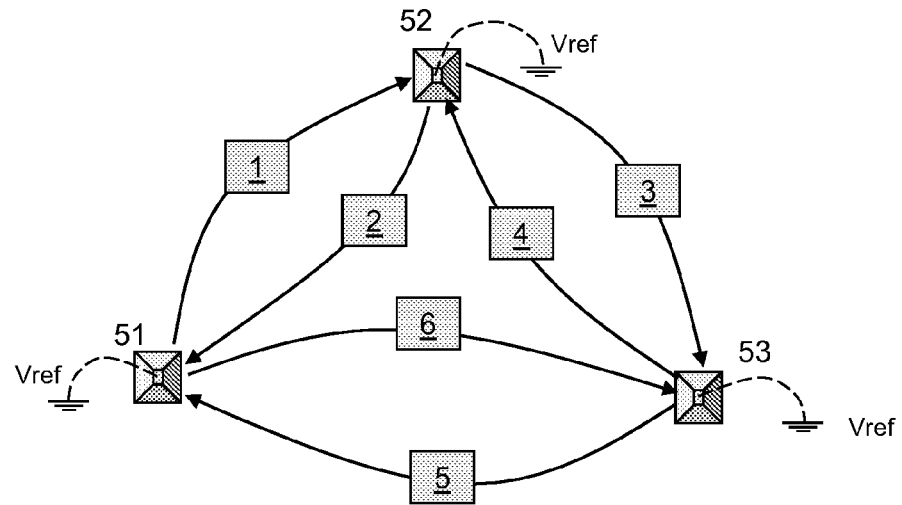
Figure 3B:
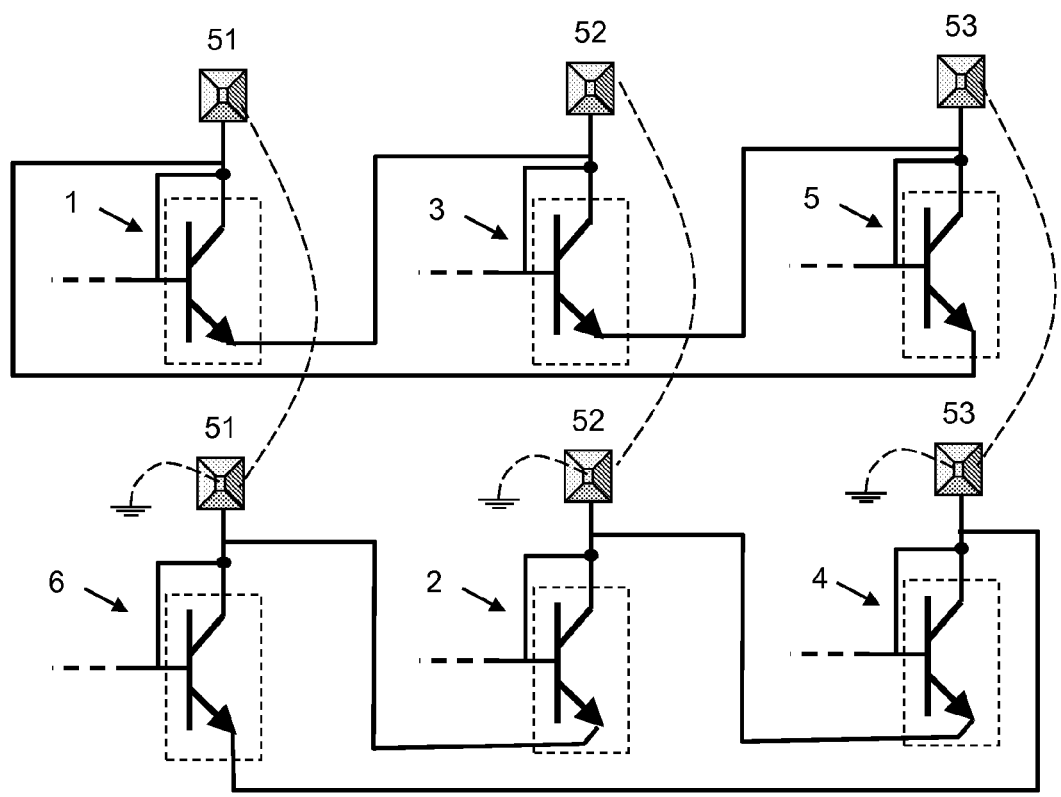

Referring to FIGS. 3a and 3b, the example shown therein comprises a third ground node 53, arranged to be connected to the voltage reference Vref. As shown, each of the nodes 51-53 is connected to other nodes via connection devices 3-6 similar to those shown in FIG. 1 or 2. In this example, each node is directly connected to each of the other nodes, thus ensuring that for each node a loss of reference voltage can be detected and that for each node an ESD impact can be absorbed.

More specific, in the example shown in FIGS. 3a and 3b, a third connection device 3 is provided between the second ground node 52 and the third ground node 53, a fourth connection device 4 is provided between the third ground node 53 and the second ground node 52. A fifth connection device 5 is provided between the third ground node 53 and the first ground node 51, and a sixth connection device 6 is provided between the first ground node 51 and the third ground node 53. The details of these further protection circuits 3,4,5,6 are not shown in FIG. 3b, but of course these connection devices 3, 4, 5 and 6 may exhibit the variants and/or optional features already explained above in respect of the first and second connection devices 1 and 2, with reference to FIGS. 1 and 2.

Figure 4:
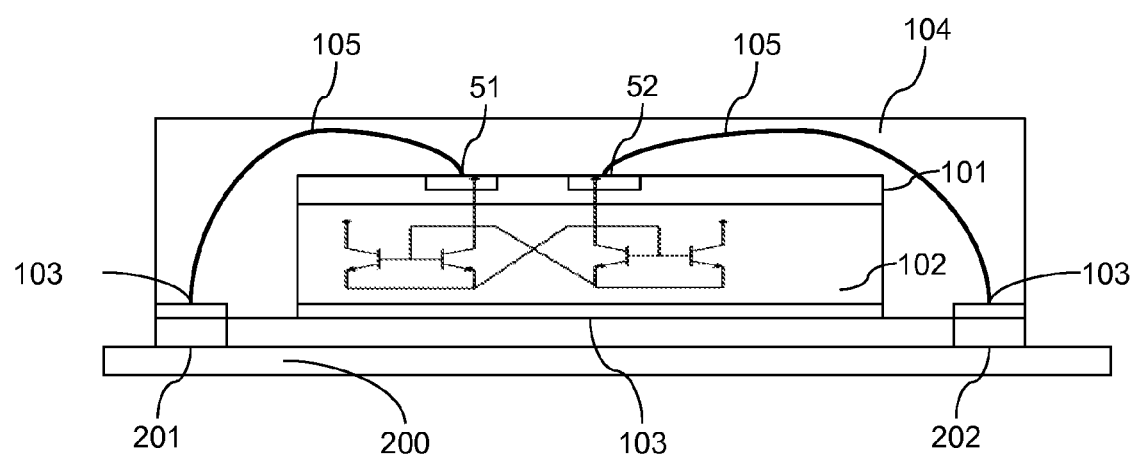
FIG. 4 shows a cross-sectional view of an example of an integrated circuit provided with a ground loss monitoring circuit.

The ground loss monitoring circuit may be implemented in any manner suitable for the specific implementation. As shown in FIG. 4, the ground loss monitoring circuit may for example be implemented in an integrated circuit which comprises one or more dies 101,102 on which electronic circuits, such as logic circuits and/or analog circuits are provided, and which are packaged in the same package 104. The dies can comprise one or more contact pads, i.e. surface areas of the die designated to provide interconnections between the die and electronic components external to the die, e.g. outside the package. For example, each of the dies may have contact pads or e.g. just some of the dies. The contact pad can for example be connected by attaching one end of a bond wire 105 to the respective contact pad and another end of the bond wire 105 to a lead 103 of the package 104, which extends to the outside of the package and is exposed to the outside. The lead can then be attached, e.g. through soldering on a printed circuit board (PCB) 200, to an electrical path 201 to electrically connect to the desired electronic components outside the package. As shown in FIG. 4, the monitoring circuit can be provided below the contact pads that serve as ground nodes 51, 52. For instance, the die may have a surface layer 101 in which the contact pads are provided, such that they are exposed. The die may comprise a substrate 102 with one or more layers below the surface layer in which the devices of the monitoring circuit are formed, with the device being situated underneath the contact pads. Thereby, the amount required die area may be reduced.

In the foregoing specification, the invention has been elucidated with reference to specific examples of embodiments of the invention. It will, however, be evident that various modifications and changes may be made therein without departing from the broader scope of the invention as set forth in the appended claims, which are hence not limited to the specific examples shown.

For example, the semiconductor substrate described herein can be any semiconductor material or combinations of materials, such as gallium arsenide, silicon germanium, silicon-on-insulator (SOI), silicon, monocrystalline silicon, the like, and combinations of the above.

Also, the connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A reference voltage loss monitoring circuit comprising:
   a first reference node and a second reference node, said reference nodes connected to a voltage reference,
   a first connection device arranged to connect the first reference node to the second reference node, comprising at least a first diode arranged to allow a current flowing from said first reference node to said second reference node and not conversely, said first diode comprising a first main transistor connected to operate as a diode,
   a second connection device arranged to connect the second reference node to the first reference node, comprising at least a second diode arranged to allow a current flowing from said second reference node to first reference node and not conversely, said second diode comprising a second main transistor connected to operate as a diode,
   each of the first and second connection devices further comprises a secondary transistor mirrored with the main transistor of said first and second connection devices respectively,
   the secondary transistor comprising an output arranged to be coupled to a diagnostic circuit, for delivering to said diagnostic circuit a signal indicative of a loss of voltage reference on a respective reference node.

2. The monitoring circuit of claim 1, in which said main transistors are bipolar transistors, each comprising a collector, a drain and a base, and wherein the collector or the drain of the first main transistor is connected to the base, of the first main transistor, and in which the collector or the drain of the second main transistor is connected to the base of the second main transistor.

3. The monitoring circuit according to claim 1, wherein the secondary transistor and the main transistors each comprise:
   a pair of current terminals; and
   a control terminal, wherein
      the control terminal of the first secondary transistor is connected to the control terminal of the first main transistor, and
      the control terminal of the second secondary transistor is connected to the control terminal of the second main transistor.

4. The monitoring circuit according to claim 1, further comprising a main filter, positioned between the main transistor and the secondary transistor, and arranged to filter from said signal components caused by a ESD discharge or a EMC spike.

5. The monitoring circuit according to claim 1, further comprising a buffer stage comprising an auxiliary transistor connected to the secondary transistor.

6. The monitoring circuit of claim 5, wherein the secondary transistor and the auxiliary transistor both comprise a pair of current terminals and a control terminal, and further comprising an auxiliary filter, arranged to filter from said signal components causes by a loss of voltage of a duration shorter than a predetermined threshold duration.

7. The monitoring circuit according to claim 1, wherein each of said main transistors comprises a pair of current terminals and a control terminal, and further comprising a EMC capacitor interposed between the control terminal and a current terminal of the main transistor and arranged to reduce an amplitude of incoming electrical spikes.

8. The monitoring circuit according to claim 1, in which the main transistor is a N-type transistor.

9. The monitoring circuit according to claim 8, in which the main N-type transistor is one of the group consisting of: N-channel FET transistor, NPN bipolar transistor.

10. The monitoring circuit according to claim 1, further comprising:
    a third reference node connected to the voltage reference, wherein
       a third connection device is arranged between the second reference node and the third reference node,
       a fourth connection device is arranged between the third reference node and the second reference node,
       a fifth connection device is arranged between the third reference node and the first reference node, and
       a sixth connection device is arranged between the first reference node and the third reference node.

11. An integrated circuit, comprising two or more reference nodes and a monitoring circuit according to claim 1.

12. The integrated circuit of claim 11, comprising a die with a surface layer comprising at least two contact pads forming said reference node, said contact pads being connectable to a voltage source external to the die, and a substrate below said surface layer, said monitoring circuit being present in said substrate and situated underneath the contact pads.

13. A control device, comprising a monitoring circuit according to claim 1 and a diagnostic circuit.

14. The monitoring circuit according to claim 2, wherein the secondary transistor and the main transistors each comprise:
    a pair of current terminals; and
    a control terminal, wherein
       the control terminal of the first secondary transistor is connected to the control terminal of the first main transistor, and
       the control terminal of the second secondary transistor is connected to the control terminal of the second main transistor.

15. The monitoring circuit according to claim 14, further comprising a main filter, positioned between the main transistor and the secondary transistor, and arranged to filter from said signal components caused by a ESD discharge or a EMC spike.

16. The monitoring circuit according to claim 14, further comprising a buffer stage comprising an auxiliary transistor connected to the secondary transistor.

17. The monitoring circuit of claim 16, wherein the secondary transistor and the auxiliary transistor both comprise a pair of current terminals and a control terminal, and further comprising an auxiliary filter arranged to filter from said signal components causes by a loss of voltage of a duration shorter than a predetermined threshold duration.

18. The monitoring circuit according to claim 16, wherein each of said main transistors comprises a pair of current terminals and a control terminal, and further comprising a EMC capacitor interposed between the control terminal and a current terminal of the main transistor and arranged to reduce an amplitude of incoming electrical spikes.

* * * * *